(12) United States Patent
Sugawara et al.

(10) Patent No.: US 12,130,514 B2
(45) Date of Patent: Oct. 29, 2024

(54) ANTI-GLARE FILM, METHOD FOR PRODUCING SAME, AND USE OF SAME

(71) Applicant: DAICEL CORPORATION, Osaka (JP)

(72) Inventors: Yoshitaka Sugawara, Tokyo (JP); Masaki Hayashi, Tokyo (JP); Kensaku Hirose, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 322 days.

(21) Appl. No.: 16/651,482

(22) PCT Filed: Sep. 21, 2018

(86) PCT No.: PCT/JP2018/034950
§ 371 (c)(1),
(2) Date: Mar. 27, 2020

(87) PCT Pub. No.: WO2019/116662
PCT Pub. Date: Jun. 20, 2019

(65) Prior Publication Data
US 2020/0257161 A1    Aug. 13, 2020

(30) Foreign Application Priority Data
Dec. 11, 2017 (JP) .................. 2017-237147

(51) Int. Cl.
G02F 1/1335  (2006.01)
B05D 7/24  (2006.01)
B32B 7/023  (2019.01)
H10K 50/00  (2023.01)

(52) U.S. Cl.
CPC ......... *G02F 1/133502* (2013.01); *B05D 7/24* (2013.01); *B32B 7/023* (2019.01); *H10K 50/00* (2023.02); *C09K 2323/00* (2020.08); *C09K 2323/06* (2020.08)

(58) Field of Classification Search
CPC .............. G02F 1/133502; B32B 7/023; C09K 2323/06; C09K 2323/00
USPC .................................... 428/1.1, 1.6; 359/601
See application file for complete search history.

(56) References Cited

U.S. PATENT DOCUMENTS

| | | | |
|---|---|---|---|
| 6,945,656 B2 | 9/2005 | Takahashi et al. | |
| 9,085,711 B1* | 7/2015 | Khatri ................ | C09D 5/00 |
| 2003/0112520 A1* | 6/2003 | Takahashi ............. | C08L 33/10 |
| | | | 359/603 |
| 2008/0255288 A1* | 10/2008 | Anderson ............. | C09D 7/70 |
| | | | 524/610 |
| 2009/0022948 A1* | 1/2009 | Takemoto ............. | G02B 1/111 |
| | | | 427/444 |
| 2009/0052043 A1 | 2/2009 | Iwata et al. | |
| 2017/0166752 A1* | 6/2017 | Kriha ................ | B41M 3/006 |

FOREIGN PATENT DOCUMENTS

| | | |
|---|---|---|
| JP | 2001-310351 A | 11/2001 |
| JP | 2003-121618 A | 4/2003 |
| JP | 2008-158483 A | 7/2008 |
| JP | 2008-225195 A | 9/2008 |
| JP | 2009-109702 A | 5/2009 |
| JP | 2009-180886 A | 8/2009 |
| JP | 4377578 B2 | 12/2009 |
| JP | 2010-122560 A | 6/2010 |
| JP | 2014-92657 A | 5/2014 |
| JP | 2014-194551 A | 10/2014 |

OTHER PUBLICATIONS

Taiwanese Office Action and Search Report for Taiwanese Application No. 107142188, dated Nov. 9, 2021.
International Search Report (PCT/ISA/210) issued in PCT/JP2018/034950, mailed on Dec. 18, 2018.
Japanese Appeal Decision of Refusal for application No. 2017-237147 mailed Feb. 4, 2020.
Japanese Office Action for application No. 2017-237147 mailed Dec. 11, 2018.
Japanese Office Action for application No. 2017-237147 mailed February 5. 2019.
Written Opinion (PCT/ISA/237) issued in PCT/JP2018/034950, mailed on Dec. 18, 2018.
English translation of International Preliminary Report on Patentability and Written Opinion mailed Jun. 25, 2020, in PCT/JP2018/034950 (Forms PCT/IB/338, PCT/IB/373, and PCT/ISA/237).
Japanese Office Action for corresponding Japanese Application No. 2019-076153, dated Nov. 9, 2021, with an English translation.
Japanese Notice of Reasons for Refusal for Japanese Application No. 2022-053962, dated Feb. 14, 2023, with an English translation.
Japanese Office Action for Japanese Application No. 2023-138279, dated Apr. 9, 2024, with an English translation.

* cited by examiner

*Primary Examiner* — Ruiyun Zhang
(74) *Attorney, Agent, or Firm* — Birch, Stewart, Kolasch & Birch, LLP

(57) ABSTRACT

An anti-glare film is prepared which have an absolute value of a chromaticity b* of transmitted light being 15 or less and a haze being 30% or greater. In this anti-glare film, the absolute value of the chromaticity b* of transmitted light may be 3 or less and a 60° gloss may be 25% or less. The anti-glare film includes a transparent substrate layer, and an anti-glare layer formed on at least one surface of the transparent substrate layer. The anti-glare layer may be a cured product of a curable composition including one or more types of a polymer component and one or more types of a curable resin precursor component, and in particular, at least two components selected from a polymer component and a curable resin precursor component can be phase separated through liquid phase spinodal decomposition. This anti-glare film has little yellowness and high anti-glare properties.

9 Claims, No Drawings

ANTI-GLARE FILM, METHOD FOR PRODUCING SAME, AND USE OF SAME

TECHNICAL FIELD

The present invention relates to an anti-glare film that can be used in various display devices such as a liquid crystal display (LCD) and an organic electroluminescence (EL) display, a method for producing the same, and use of the same.

BACKGROUND ART

Anti-glare films are widely used as films that prevent reflection of outside scenery on a display screen of an image display device, such as an LCD and an organic EL display, and improve visibility. Examples of optical properties required for anti-glare films include functionality of improving anti-glare properties by having high haze, high transparency (total light transmittance), and visibility improved by giving the viewing side a neutral white coloration of light instead of color biased to yellow or red. A known method of achieving such functionality includes a method for producing an anti-glare film to express anti-glare properties where a mixture of fine particles and binder resin or curable resin is applied to a base material and specular reflection is prevented by forming fine recesses and protrusions on the surface. However, in an anti-glare film made using fine particles, the intensity distribution of transmitted scattered light is controlled by particle size, and thus sparkle and character blur on the display screen is not effectively prevented. Also, in an anti-glare film with dispersed fine particles, the haze value is dependent upon the difference in the refractive index between the matrix material constituting the anti-glare film and the dispersed fine particles. A greater difference means a higher haze value and thus higher light diffusion properties. However, by increasing an internal haze, short wavelength light is scattered at large angles, and the display device looks yellow or darkened in viewing from the front, and thus visibility is reduced. In addition, because the backscattering tends to occur, transparency is also decreased.

A method of forming recesses and protrusions on a surface using spinodal decomposition of immiscible resin components is known. For example, JP 2014-85371 A (Patent Document 1) describes an anti-glare film that includes an anti-glare layer with elongated protrusion portions on the surface formed by phase separation of a plurality of resin components, and the elongated protrusion portions have a branched structure and a total length of 100 μm or greater, and one or more elongated protrusion portions are disposed in every 1 mm² of the surface of the anti-glare layer. This anti-glare film has an excellent balance between haze and clarity, and when used in a high definition display device (for example, an LCD or organic EL display having a resolution of 200 ppi or greater), the anti-glare film can improve anti-glare properties, greatly suppress sparkle, and suppress character blur.

However, improving the transparency of this anti-glare film may result in reduction of the anti-glare properties. In related art methods, to improve anti-glare properties, light scattering properties must be improved and a haze must be adjusted to be high. However, because of the trade-off relationship between anti-glare properties and transparency (in particular, suppressing yellowness), obtain both in a compatible manner is difficult.

JP 5531388 B (Patent Document 2) describes a method of stably manufacturing an optical sheet having excellent contrast, as a method of stably supplying an optical sheet having good contrast, in which, for a method of manufacturing the optical sheet including a function layer on at least one surface of a transparent base material, the function layer including scattered elements on an outermost surface and/or internally, a ratio of scattered specular reflection intensity to a total of a scattered reflection intensity measured at a preset angle is controlled to be greater than 0.19.

However, even with the optical sheet obtained by this method, it is difficult to improve transparency.

CITATION LIST

Patent Document

Patent Document 1: JP 2014-85371 A (Claim 1, paragraph [0021])
Patent Document 2: U.S. Pat. No. 5,531,388 B (Claim 1)

SUMMARY OF INVENTION

Technical Problem

In light of the above, an object of the present invention is to provide an anti-glare film with little yellowness and high anti-glare properties, a method for producing the same, and use of the same.

Solution to Problem

As a result of diligent research to achieve the object described above, the present inventors discovered that by preparing an anti-glare film having an absolute value of a chromaticity b* of transmitted light being 15 or less and a haze being to 30% or greater, yellowness can be suppressed and anti-glare properties can be improved, and the present invention was realized.

In other words, an anti-glare film according to the present invention has an absolute value of a chromaticity b* of transmitted light being 15 or less and a haze being 30% or greater. The anti-glare film may have the absolute value of the chromaticity b* of transmitted light being 3 or less and a 60° gloss being 25% or less. The anti-glare film may include a transparent substrate layer, and an anti-glare layer formed on at least one surface of the transparent substrate layer. The anti-glare layer is a cured product of a curable composition including one or more types of a polymer component and one or more types of a curable resin precursor component. At least two components selected from the polymer component and the curable resin precursor component may be able to be phase separated through liquid phase spinodal decomposition. The polymer component may include a (meth)acrylic polymer that optionally has a cellulose ester and/or a polymerizable group. The cured resin precursor component may include at least one type selected from polyfunctional (meth)acrylate, epoxy (meth)acrylate, polyester (meth)acrylate, urethane (meth)acrylate, and silicone (meth)acrylate. The curable resin precursor component may include a silica nanoparticle and/or a fluorine atom.

The present invention also includes a method for producing the anti-glare film including curing a curable composition by heat or an active energy ray. The method for producing may further include phase separating, through liquid phase spinodal decomposition, at least two components selected from a polymer component and a curable resin precursor component by applying a curable composition including one or more types of polymer components and one or more types of curable resin precursor components on a support and drying. In the curing, a phase separated curable composition may be cured by heat or an active energy ray.

The present invention also includes a display device including the anti-glare film. The display device may be an organic EL display or a liquid crystal display.

The present invention includes a method of increasing anti-glare properties and visibility of an anti-glare film, including adjusting an absolute value of a chromaticity b* of transmitted light being 15 or less and adjusting a haze being 30% or greater.

Note that in the present specification and the claims, (meth) acrylate includes both methacrylic acid esters and acrylic acid esters.

Advantageous Effects of Invention

In the anti-glare film of the present invention, the absolute value of the chromaticity b* of transmitted light is 15 or less and the haze is 30% or greater. Thus, coloration (non-coloring properties) and anti-glare properties can be obtained in a compatible manner. In particular, yellowness can be reduced and anti-glare properties can be improved while suppressing yellowness.

DESCRIPTION OF EMBODIMENTS

Optical Properties of Anti-Glare Film

In the anti-glare film of the present invention, an absolute value of chromaticity b* and a haze are adjusted within a specific range. Thus, anti-glare properties and transparency (in particular, suppressing yellowness) can be obtained in a compatible manner.

In the anti-glare film of the present invention, the absolute value of the chromaticity b* of the transmitted light (transmitted hue) is required to be 15 or less (for example, from 0 to 15) and, for example, 10 or less (for example, 5 or less), preferably 3 or less, more preferably 2 or less, and particularly preferably 1 or less (for example, from 0.1 to 1). When the chromaticity b* is greater than 15, yellowness and blueness are increased and the film looks darkened, reducing transparency.

Note that in the present specification and claims, the transmitted hue b* can be measured by a spectrophotometer ("U-3010" available from Hitachi High-Tech Science Corporation) in accordance with JIS Z8781.

The haze of the anti-glare film of the present invention is required to be 30% or greater (for example, from 30 to 100%) and, for the perspective of improving anti-glare properties, is, for example, 40% or greater (for example, from 40 to 99%), preferably from about 50 to 98% (for example, from 70 to 97%), and more preferably from about 80 to 96% (particularly from 85 to 95%). When haze is too low, anti-glare properties may be reduced.

The total light transmittance of the anti-glare film of the present invention is, for example, 70% or greater (for example, from 70 to 100%), preferably from about 80 to 99.9%, and more preferably from about 85 to 99% (particularly, from 90 to 98%). When the total light transmittance is too low, transparency may be reduced.

In the present specification and claims, haze and total light transmittance can be measured according to JIS K7105 using a haze meter ("NDH-5000W" available from Nippon Denshoku Industries Co., Ltd.).

Anti-Glare Layer

The anti-glare film of the present invention is required to include an anti-glare layer to achieve the optical properties described above. Other than this, the materials and structure are not limited. However, typically, anti-glare properties can be improved by forming the fine recesses and protrusions in the surface with a transparent material to reduce reflection of outside scenery, which is caused from surface reflections, by the recesses and protrusions.

The 60° gloss of the surface of the anti-glare layer (at least one surface of the anti-glare film when the anti-glare film includes only an anti-glare layer) may be 90% or less and, for example, from about 0 to 25%, preferably from about 0.1 to 20% (for example, from 0.2 to 10%), and more preferably from about 0.3 to 5% (particularly, from 0.5 to 1%), for example. When 60° gloss is too great, anti-glare properties may be reduced.

In the present specification and claims, the 60° gloss can be measured using a gloss meter ("IG-320" manufactured by Horiba, Ltd.) in accordance with JIS Z8741.

The anti-glare film of the present invention may include a single anti-glare layer or may include a transparent substrate layer and an anti-glare layer formed on at least one surface of the transparent substrate layer.

The anti-glare layer is required to be formed of a transparent material. The material may be organic or inorganic material. However, from the perspective of productivity and handling properties, an anti-glare layer formed of a composition including a resin component is preferable. The surface of the anti-glare layer typically includes recesses and protrusions. The recesses and protrusions are not particularly limited and may be formed by physical processing or transfer using a mold. However, from the perspective of productivity and the like, for the anti-glare layer formed of a composition including a resin component, the fine recesses and protrusions corresponding to the shape of fine recesses and protrusions and particles formed by the phase separated structure of the resin component may be adopted. Among these, in a cured product of cured composition including at least one type of curable resin precursor component, recesses and protrusions formed through spinodal decomposition from a liquid phase (liquid phase spinodal decomposition) or recesses and protrusions formed by the particle shape of impregnated particles (for example, thermoplastic resin particles such as polyamide particles, crosslinked polymer particles such as crosslinked poly(meth)acrylate particles, crosslinked polystyrene particles, crosslinked polyurethane particles, and the like) are preferable and, from the perspective of facilitating formation of recesses and protrusions to achieve transparency and anti-glare properties in a compatible manner, recesses and protrusions formed through liquid phase spinodal decomposition is particularly preferable.

The anti-glare layer including the recesses and protrusions formed through liquid phase spinodal decomposition may be a cured product of a curable composition including one or more types of a polymer component and one or more types of a curable resin precursor component. Specifically, the anti-glare layer may be formed in a phase separated structure generally having a regular phase to phase distance by the phase separation, which proceeded through the spinodal decomposition as the concentration of the mixed liquid increased in the process of evaporating or removing the solvent from the liquid phase of the composition by drying or the like. The composition (mixed liquid) used includes one or more types of a polymer component and one or more types of a curable resin precursor component. Specifically, the liquid phase spinodal decomposition is typically performed by coating a support with the composition (homogeneous mixed liquid) and vaporizing the solvent from the applied layer. When a peelable support is used as the support, an anti-glare film formed of only an anti-glare layer can be obtained by peeling the anti-glare layer from the support. When a transparent non-peelable support (transparent substrate layer) is used as the support, an anti-glare film with a multilayer structure formed of the transparent substrate layer and the anti-glare layer can be obtained.

Polymer Component

As the polymer component, a thermoplastic resin is typically used. The thermoplastic resin is not particularly limited as long as it has high transparency and can form the above-mentioned surface recesses and protrusions through the spinodal decomposition, but examples of the thermoplastic resin include a styrene-based resin, a (meth)acrylate polymer, an organic acid vinyl ester polymer, a vinyl ether-based polymer, a halogen-containing resin, polyolefin (including alicyclic polyolefin), polycarbonate, polyester, poly amide, thermoplastic polyurethane, a polysulfone-based resin (polyether sulfone, polysulfone, and the like), a polyphenylene ether-based resin (polymer of 2,6-xylenol and the like), a cellulose derivative (cellulose esters, cellulose carbamates, cellulose ethers, and the like), a silicone resin (poly dimethylsiloxane, polymethylphenylsiloxane, and the like), and rubber or elastomer (diene rubber such as polybutadiene and polyisoprene, a styrene-butadiene copolymer, an acrylonitrile-butadiene copolymer, acrylic rubber, urethane rubber, and silicone rubber, and the like). These thermoplastic resins can be used alone or in combination of two or more.

Of the polymer components, styrene-based resins, (meth)acrylic polymers, vinyl acetate-based polymers, vinyl ether-based polymers, halogen-containing resins, alicyclic polyolefins, poly carbonates, polyesters, polyamides, cellulose derivatives, silicone-based resins, rubbers, or elastomers are generally used. Also, the polymer component is typically non-crystalline, and a polymer component soluble in an organic solvent (particularly, a common solvent that can dissolve a plurality of polymer components and curable resin precursor components) is used. In particular, polymer components having high moldability or film forming properties, transparency, and weather resistance, such as styrene-based resins, (meth)acrylic polymers, alicyclic polyolefins, polyester-based resins, cellulose derivatives (cellulose esters and the like) are preferable and (meth)acrylic polymers and cellulose esters are particularly preferable.

As the (meth)acrylate polymer, a homopolymer or a copolymer of a (meth)acrylate monomer, or a copolymer of a (meth)acrylate monomer and a copolymerizable monomer can be used. Examples of the (meth)acrylate monomer include: (meth)acrylic acid; $C_{1-10}$ alkyl (meth)acrylate such as methyl (meth)acrylate, ethyl (meth)acrylate, butyl (meth)acrylate, t-butyl (meth)acrylate, isobutyl (meth)acrylate, hexyl (meth)acrylate, octyl (meth)acrylate, and 2-ethylhexyl (meth)acrylate; aryl (meth)acrylate such as phenyl (meth)acrylate; hydroxyalkyl (meth)acrylates such as hydroxyethyl (meth)acrylate and hydroxypropyl (meth)acrylate; glycidyl (meth)acrylate; N,N-dialkylaminoalkyl (meth)acrylate; (meth)acrylonitrile; and (meth)acrylate having an alicyclic hydrocarbon group such as tricyclodecane. Examples of the copolymerizable monomer include a styrene monomer such as styrene, a vinyl ester-based monomer, maleic anhydride, maleate, and fumarate. These monomers can be used alone or in combination of two or more.

Examples of the (meth)acrylate-based polymer include poly(meth)acrylate ester such as polymethylmethacrylate, a methylmethacrylate-(meth)acrylate copolymer, a methylmethacrylate-(meth)acrylate ester copolymer, a methylmethacrylate-acrylate ester-(meth)acrylate copolymer, and a (meth)acrylate ester-styrene copolymer (MS resin and the like). Among those, poly $C_{1-6}$ alkyl(meth)acrylate such as poly methyl(meth)acrylate, and in particular, a methyl methacrylate-based polymer composed of methylmethacrylate as a main component (from about 50 to 100 wt. % and preferably from about 70 to 100 wt. %, for example) is preferred.

Examples of the cellulose esters include aliphatic organic acid ester (cellulose acetates such as cellulose diacetate and cellulose triacetate; $C_{1-6}$ aliphatic carboxylic acid ester such as cellulose propionate, cellulose butyrate, cellulose acetate propionate, and cellulose acetate butyrate, and the like), aromatic organic acid esters ($C_{7-12}$ aromatic carboxylic acid esters such as cellulose phthalate and cellulose benzoate), inorganic acid esters (for example, cellulose phosphate, cellulose sulfate, and the like), and the cellulose esters may be mixed acid esters such as acetic acid and cellulose nitrate eater. These cellulose esters can be used alone or in combination of two or more. Among those, cellulose diacetates, cellulose triacetates, and cellulose $C_{2-4}$ acylates such as cellulose acetate propionates and cellulose acetate butyrates are preferred, and cellulose acetate $C_{3-4}$ acylates such as cellulose acetate propionates are particularly preferred.

The polymer component (particularly, the (meth)acrylate-based polymer) may be a polymer having a functional group involved in the curing reaction (or a functional group able to react with the curable resin precursor component). The polymer may have a functional group in the main chain or side chain. The functional group may be introduced into the main chain by copolymerization or co-condensation, but is usually introduced into the side chain. Examples of the functional group include condensable groups, reactive groups (for example, a hydroxyl group, an acid anhydride group, a carboxyl group, an amino group or an imino group, an epoxy group, a glycidyl group, or an isocyanate group), and polymerizable groups (for example, $C_{2-6}$ alkenyl groups such as vinyl, propenyl, isopropenyl, butenyl, and allyl groups, $C_{2-6}$ alkynyl group such as ethynyl, propynyl, and butynyl groups, $C_{2-6}$ alkenylidene groups such as a vinylidene group, or a group (such as a (meth)acryloyl group) having a polymerizable group thereof). Of these functional groups, a polymerizable group is preferable.

Examples of the method for introducing a polymerizable group into a side chain include a method in which a thermoplastic resin having a functional group such as a reactive group and a condensable group is reacted with a polymerizable compound having a group that is reactive with the functional group.

For the thermoplastic resin having the functional group, examples of the functional group include a carboxyl group or an acid anhydride group thereof, a hydroxyl group, an amino group, and an epoxy group.

When the thermoplastic resin having the functional group is a thermoplastic resin having a carboxyl group or an acid anhydride group thereof, examples of the polymerizable compound having a group reactive with the functional group described above include a polymerizable compound having an epoxy group or a hydroxyl group, an amino group, an isocyanate group, and the like. Among those, the polymerizable compound having the epoxy group, for example, epoxycyclo $C_{5-8}$ alkenyl (meth)acrylate such as epoxycyclohexenyl (meth)acrylate, glycidyl (meth)acrylate, and allylglycidylether, are widely used.

Representative examples include a combination of a thermoplastic resin having a carboxyl group or an acid anhydride group thereof and a compound containing an epoxy group, and particularly include a combination of a (meth)acrylate-based polymer ((meth)acrylate-(meth)acrylate ester copolymer and the like) and epoxy group-containing (meth)acrylate (epoxycycloalkenyl (meth)acrylate, glycidyl (meth)acrylate, and the like). Specifically, a polymer in which a polymerizable unsaturated group is introduced into a part of carboxyl groups of a (meth)acrylate polymer, for example, a (meth)acrylic copolymer (cyclomer-P available from Daicel Corporation) in which a polymerizable group (photopolymerizable unsaturated group) is introduced into a side chain by reacting an epoxy group of 3,4-epoxy cyclohexenylmethyl acrylate with a part of carboxyl groups of a (meth)acrylate-(meth)acrylate ester copolymer can be used.

The amount of the functional group (in particular, the polymerizable group) involved in the curing reaction for thermoplastic resin introduced into the thermoplastic resin is, for example, from about 0.001 to 10 moles, preferably from about 0.01 to 5 moles, and more preferably from about 0.02 to 3 moles with respect to 1 kg of the thermoplastic resin.

These polymer components can be used in combination as appropriate. That is, the polymer component may be composed of a plurality of polymers. These plurality of polymers may be phase separable through liquid phase spinodal decomposition. Also, the plurality of polymers may be mutually immiscible. When the plurality of polymers are combined, the combination of a first polymer and a second polymer is not particularly limited, and a plurality of polymers which are mutually immiscible near a processing temperature, for example, two immiscible polymers, can be appropriately mixed and used. For example, when the first polymer is a (meth)acrylic polymer (for example, polymethyl methacrylate, a (meth)acrylic polymer having a polymerizable group, and the like), the second polymer may be a cellulose ester (such as a cellulose acetate $C_{3-4}$ acylate such as cellulose acetate propionate), a polyester (such as a urethane-modified polyester).

Furthermore, from the perspective of scratch resistance after curing, at least one of the plurality of polymers, for example, one of the mutually immiscible polymers (at least one of the polymers when the first polymer and the second polymer are combined), is preferably a polymer that has a functional group (particularly, a polymerizable group) capable of reacting with the cured resin precursor component in the side chain.

The weight ratio between the first polymer and the second polymer (first polymer/second polymer) can, for example, be selected from a range from about 1/99 to 99/1 and preferably from about 5/95 to 95/5. When the first polymer is a (meth)acrylic polymer and the second polymer is a cellulose ester, the weight ratio between the polymers (first polymer/second polymer) is, for example, from about 50/50 to 99/1, preferably from about 55/45 to 90/10, and more preferably from about 60/40 to 80/20 (particularly from 65/35 to 75/25).

Note that the polymer for forming the phase separated structure may include a thermoplastic resin or another polymer in addition to the two immiscible polymers described above.

A glass transition temperature of the polymer component can be selected, for example, from the range of from about −100° C. to 250° C., preferably from about −50° C. to 230° C., and more preferably from about 0 to 200° C. (for example, from about 50 to 180° C.). From the viewpoint of surface hardness, the glass transition temperature is advantageously 50° C. or higher (for example, from about 70 to 200° C.), and preferably from 100° C. or higher (for example, from about 100 to 170° C.). A weight average molecular weight of the polymer component can be selected, for example, from the range of about 1000000 or less and preferably from about 1000 to 500000.

Curable Resin Precursor Component

The curable resin precursor component is a compound having a functional group that undergoes a reaction by heat, active energy rays (such as ultraviolet rays or electron beams) and the like, and various curable compounds which undergo curing or crosslinking by heat, active energy rays or the like and capable of forming a resin (in particular, cured or crosslinked resin) can be used. Examples of the curable resin precursor component include a thermosetting compound or a resin (low molecular weight compounds having an epoxy group, a polymerizable group, an isocyanate group, an alkoxysilyl group, a silanol group, and the like (for example, an epoxy resin, an unsaturated polyester resin, a urethane resin, and a silicone resin)), a photocurable compound which can be cured by active rays (such as ultraviolet rays, electron beam (EB), and the like) (ultraviolet curable compounds, such as photocurable monomer and oligomers, and electron beam curable compounds), and the like. Note that the photocurable compound such as a photocurable monomer, a photocurable oligomer, and a photocurable resin that may have a low molecular weight may be simply referred to as a "photocurable resin".

Examples of the photocurable compound include a monomer and an oligomer (or resin, in particular, low molecular weight resin).

Examples of the monomer include monofunctional monomers [(meth)acrylate-based monomers such as (meth)acrylate ester, vinyl-based monomers such as vinylpyrrolidone, (meth)acrylate having a bridged cyclic hydrocarbon group such as isobornyl (meth)acrylate and adamantyl (meth)acrylate], and a polyfunctional monomer having at least two polymerizable unsaturated bonds [alkylene glycol di(meth)acrylates such as ethylene glycol di(meth)acrylate, propylene glycol di(meth)acrylate, butanediol di(meth)acrylate, neopentyl glycol di(meth)acrylate, and hexanediol di(meth)acrylate; (poly)oxyalkylene glycol di(meth)acrylates such as diethylene glycol di(meth)acrylate, dipropylene glycol di(meth)acrylate, poly oxytetramethylene glycol di(meth)acrylate; di(meth)acrylates having a crosslinking cyclic hydrocarbon group such as tricyclodecane dimethanol di(meth)acrylate and adamantane di(meth)acrylate; and a polyfunctional monomer having about 3 to 6 polymerizable unsaturated bonds such as glycerin tri(meth)acrylate, trimethylolpropane tri(meth)acrylate, trimethylolethane tri(meth)acrylate, pentaerythritol tri(meth)acrylate, ditrimethylolpropane tetra(meth)acrylate, pentaerythritol tetra(meth)acrylate, dipentaerythritol penta(meth)acrylate, dipentaerythritol hexa(meth)acrylate], and the like.

Examples of the oligomer or the resin include (meth)acrylate of a bisphenol A-alkylene oxide adduct, epoxy (meth)acrylate [bisphenol A type-epoxy (meth)acrylate, novolac-type epoxy (meth)acrylate, and the like], polyester (meth)acrylate [for example, aliphatic polyester-type (meth)acrylate, aromatic polyester-type (meth)acrylate, and the like], (poly)urethane (meth)acrylate [polyester-type urethane (meth)acrylate, polyether-type urethane (meth)acrylate, and the like], and silicone (meth)acrylate, and the like.

These photocurable compounds can be used alone or in combination of two or more. Among those, the photocurable compound that can be cured in a short time, for example, an ultraviolet curable compound (monomer, oligomer, and resin that may have a low molecular weight), and an EB curable compound are preferable. In particular, the practically advantageous photocurable compound (resin precursor component) is an ultraviolet curable compound. In addition, to improve resistance such as scratch resistance, the photocurable compound is preferably a compound having 2 or more (preferably from 2 to 6 and more preferably from 2 to 4, for example) polymerizable unsaturated bonds in the molecule.

A weight average molecular weight of the curable resin precursor component is not particularly limited, but in consideration of miscibility with the polymer, the weight average molecular weight may be, for example, about 5000 or less, preferably about 2000 or less, and more preferably about 1000 or less, for example.

Depending on the type, the cured resin precursor component may include a filler and/or a fluorine atom and thus improve the transparency and the anti-glare properties of the anti-glare film.

Examples of the filler include inorganic particles such as silica particles, titania particles, zirconia particles, and alumina particles, organic particles such as crosslinked (meth) acrylate-based polymer particles, and crosslinked styrene resin particles. These fillers can be used alone or in combination of two or more.

Among these fillers, nanometer-sized silica particles (silica nanoparticles) are preferable from the viewpoint of superior optical properties and easily forming recesses and protrusions, through spinodal decomposition, which provide transparency and anti-glare property in a compatible manner. The silica nanoparticles are preferably solid silica nanoparticles from the viewpoint that the yellowness of the anti-glare film can be suppressed. In addition, an average particle diameter of the silica nanoparticles is, for example, from about 1 to 800 nm, preferably from about 3 to 500 nm, and more preferably from about 5 to 300 nm.

The ratio of the filler (in particular, silica nanoparticles) may be about 10 to 90 wt. %, for example, from about 10 to 80 wt. %, preferably from about 15 to 70 wt. %, and more preferably from about 20 to 50 wt. % with respect to the entire curable resin precursor component.

Examples of the precursor component (fluorine-based compound having a fluorine-containing curable compound or polymerizable group) containing the fluorine atom include fluorides of the monomer and the oligomer, for example, fluorinated alkyl (meth)acrylate [for example, perfluorooctyl ethyl (meth)acrylate, trifluoroethyl (meth)acrylate, and the like], fluorinated (poly)oxyalkylene glycol di(meth)acrylate [for example, fluoroethylene glycol di(meth) acrylate, fluoropolyethylene glycol di(meth)acrylate, fluoropropylene glycol di(meth)acrylate, and the like], a fluorine-containing epoxy resin, a fluorine-containing urethane-based resin, and the like. Among those, a fluoropolyether compound having a (meth)acryloyl group is preferred. The fluorine-containing curable compound may be a commercially available fluorine-based polymerizable leveling agent.

The curable resin precursor component may further include a curing agent depending on the type of the curable resin precursor component. For example, the thermosetting resin may include a curing agent such as amines and polyvalent carboxylic acids, and the photocurable resin may include a photopolymerization initiator. Examples of the photopolymerization initiator include the known components such as acetophenones or propiophenones, benzyls, benzoins, benzophenones, thioxanthones, acylphosphine oxides, and the like. The ratio of a curing agent such as the photopolymerization initiator is, for example, from about 0.1 to 20 wt. %, preferably from about 0.5 to 10 wt. %, and more preferably from about 1 to 8 wt. % with respect to the entire curable resin precursor component.

The curable resin precursor component may further include a curing accelerator. For example, the photocurable resin may include a photocuring accelerator, for example, a tertiary amines (such as a dialkylaminobenzoate), and a phosphine-based photopolymerization accelerator.

Of these cured resin precursor components, a polyfunctional (meth)acrylate (for example, a (meth)acrylate having from about 2 to 8 polymerizable groups, such as dipentaerythritol hexa (meth)acrylate); epoxy (meth) acrylate, polyester (meth)acrylate, urethane (meth)acrylate, silicone (meth)acrylate, and the like are preferable. Furthermore, the cured resin precursor component preferably includes silica nanoparticles and/or fluorine atoms, and particularly includes a silica nanoparticle-containing photocurable compound (in particular, a polyfunctional (meth)acrylate including silica nanoparticles, a urethane (meth)acrylate including silica nanoparticles, and a silicone (meth)acrylate including silica nanoparticles) and a fluorine-containing curable compound.

Preferred combinations for the curable resin precursor component include, for example, a combination of a silica nanoparticle-containing photocurable compound and a silicone (meth)acrylate, a combination of a urethane (meth) acrylate, a trifunctional to hexafunctional (meth)acrylate, a silicone (meth)acrylate, and a fluorine-containing curable compound, and a combination of a silica nanoparticle-containing photocurable compound and a fluorine-containing curable compound. A particularly preferable combination includes a combination of a silica nanoparticle-containing photocurable compound and a fluorine-containing curable compound.

In the present invention, from the perspective of facilitating formation of recesses and protrusions for obtaining transparency and anti-glare properties in a compatible manner, to achieve the proportion described above of silica nanoparticles in the entire curable resin precursor component, the curable resin precursor component preferably includes the silica nanoparticle-containing curable resin precursor component. Also, the proportion of the fluorine-containing curable compound in the entire curable resin precursor component is, for example, from about 0.001 to 1 wt. % (for example, from 0.01 to 0.5 wt. %), preferably from 0.02 to 0.3 wt. % (for example, from 0.03 to 0.2 wt. %), and more preferably from 0.05 to 0.1 wt. %.

Combination of Polymer Component and Curable Resin Precursor Component

In the present invention, at least two components of the polymer component and the curable resin precursor component are used in a combination in which the at least two components phase separate from one another near the processing temperature. Examples of the combination that undergo phase separation include (a) a combination in which a plurality of polymer components are immiscible one another and phase separate, (b) a combination in which a polymer component and a curable resin precursor component are immiscible and phase separate, and (c) a combination in which a plurality of curable resin precursor components are immiscible one another and phase separate. Of these combinations, typically the combination (a) of a plurality of polymer components, and the combination (b) of a polymer and a curable resin precursor are used, and the combination of (a) a plurality of polymer components is preferable. If both components to be phase separated have high miscibility, they do not effectively phase separate in the drying process for vaporizing the solvent, and the function as an anti-glare layer is decreased.

Note that the polymer component and the curable resin precursor component are typically immiscible. In the case of the polymer component and the cured resin precursor component being immiscible and phase separated, a plurality of polymer components may be used as the polymer component. When a plurality of polymer components are used, at least one of the polymer components is required to be immiscible with the curable resin precursor component. The other polymer components may be miscible with the curable resin precursor component. Also, a combination of two polymer components that are immiscible each other and a curable resin precursor component (in particular, a monomer or oligomer having a plurality of curable functional groups) may be used.

In the case where the polymer component includes a plurality of polymer components that are immiscible one another and phase separates, the combination includes a curable resin precursor component which is miscible with at least one polymer component of the plurality of immiscible polymer components near the processing temperature. That is, in the case where the plurality of polymer components that are immiscible one another include a first polymer and a second polymer, for example, the curable resin precursor component is required to be miscible with the first polymer or the second polymer, or required to be miscible with both polymer components, but is preferably miscible with only one of the polymer components. In the case where it is miscible with both polymer components, a mixture including the first polymer and the curable resin precursor component as main components and a mixture of the second polymer and the curable resin precursor component as main components phase separate into at least a dual phase.

If the selected plurality of polymer components have high miscibility, the polymer components do not effectively phase separate with one another in the drying process for vaporizing the solvent, and the function as an anti-glare layer is decreased. The phase separation capability of the plurality of polymer components can be simply determined by preparing a homogeneous solution of the polymer components by using a good solvent for the each component, and by visually observing whether a residual solid becomes cloudy during the process of gradual vaporization of the solvent.

Also, the refractive index of the polymer component and the refractive index of the cured resin or crosslinked resin produced by curing the curable resin precursor mutually differ. Moreover, the refractive indexes of the plurality of polymer components (the first polymer and the second polymer) also mutually differ. The difference in refractive index between the polymer component and the cured or crosslinked resin, and the difference in refractive index between the plurality of polymer components (the first polymer and the second polymer) may be, for example, from about 0.001 to 0.2, and preferably from about 0.05 to 0.15.

The ratio (weight ratio) between the polymer component and the curable resin precursor component is not particularly limited, and can be selected, for example, (polymer component/curable resin precursor component) from the range of from about 1/99 to 95/5, for example from about 2/98 to 90/10, preferably from about 3/97 to 80/20, and more preferably from about 5/95 to 70/30. Also, when the curable resin precursor component includes a silica nanoparticle-containing photocurable compound, the ratio may be, for example, from about 2/98 to 30/70, preferably from about 3/97 to 20/80, and more preferably from about 5/95 to 15/85. Furthermore, when the curable resin precursor component does not include a silica nanoparticle-containing photocurable compound, the ratio may be, for example, from about 10/90 to 60/40, preferably from about 20/80 to 50/50, and more preferably from about 30/70 to 40/60.

Other Components

The anti-glare layer formed from a composition including a resin component may also contain various additives, such as leveling agents, stabilizers (antioxidants, ultraviolet absorbing agents, etc.), surfactants, water-soluble polymers, fillers, cross-linking agents, coupling agents, coloring agents, flame retardants, lubricants, waxes, preservatives, viscosity modifiers, thickening agents, or antifoaming agents. The total proportion of the additives to the entire anti-glare layer is, for example, from about 0.01 to 10 wt. % (in particular, from 0.1 to 5 wt. %).

Thickness of Anti-Glare Layer

The thickness (average thickness) of the anti-glare layer may be, for example, from about 0.3 to 20 µm, preferably from about 1 to 15 µm (for example, from 1 to 10 µm), and is typically from about 3 to 12 µm (particularly, from 4 to 10 µm). Note that in the case where the anti-glare film is constituted by the anti-glare layer only, the thickness (average thickness) of the anti-glare layer is, for example, from about 1 to 100 µm, and preferably from about 3 to 50 µm.

Transparent Substrate Layer

The transparent substrate layer is required to be made of a transparent material. The transparent material can be selected according to use and may be an inorganic material such as glass, but an organic material is widely used from the viewpoint of strength and moldability. Examples of the organic material include a cellulose derivative, polyester, polyamide, polyimide, polycarbonate, and a (meth)acrylic polymer. Among those, the cellulose ester, the polyester, and the like are widely used.

Examples of the cellulose ester include cellulose acetate such as cellulose triacetate (TAC), and cellulose acetate $C_{3-4}$ acylate such as cellulose acetate propionate and cellulose acetate butyrate. Examples of the polyester include polyalkylenearylates such as polyethylene terephthalate (PET) and polyethylene naphthalate (PEN).

Among those, poly $C_{2-4}$ alkylenearylates such as PET and PEN are preferred from the perspective of having an excellent balance in mechanical properties, transparency, or the like.

The transparent substrate layer may also include a commonly used additive given as an example in the section on the anti-glare layer. The proportion of the additive is the same as for the anti-glare layer.

The transparent substrate layer may be a uniaxially or biaxially stretched film, but may also be an unstretched film from the perspective of having a low birefringence and excellent optically isotropic properties.

The transparent substrate layer may be subjected to surface treatment (for example, corona discharge treatment, flame treatment, plasma treatment, ozone or ultraviolet irradiation treatment, or the like), and may include an easily adhesive layer.

The thickness (average thickness) of the transparent substrate layer is, for example, from about 5 to 2000 µm, preferably from about 15 to 1000 µm, and more preferably from about 20 to 500 µm.

Adhesive Layer

The anti-glare film of the present invention can also be used as a protective film on a touch screen display device such as a smart phone and a PC (tablet PC and the like). In these applications, the adhesive layer may be formed on at least a portion of the other surface of the transparent substrate layer.

The adhesive layer is formed of a typical transparent adhesive. Examples of the adhesive include rubber-based adhesives, acrylic adhesives, olefin-based adhesives (such as modified olefin adhesives), and silicone-based adhesives. Among these adhesives, silicone-based adhesives are preferable from the perspective of optical properties, reworkability, or the like.

The thickness (average thickness) of the adhesive layer is, for example, from about 1 to 150 μm, preferably from about 10 to 100 μm, more preferably from about 20 to 70 μm (particularly from 25 to 50 μm).

The adhesive layer may be formed on the entire surface of the other surface, or may be formed on a portion (for example, a peripheral portion) of the other surface. Further, in a case where the adhesive layer is formed on the peripheral portion, in order to improve the handling during adhering, the adhesive layer can be formed on a frame-like member which is formed on the peripheral portion of the anti-glare film (for example, a plastic sheet layered on the peripheral portion).

Method for Producing Anti-Glare Film

The method for producing the anti-glare film of the present invention is not particularly limited and can be appropriately selected according to the type of material. The method may include forming by transfer using a physical process or mold, and from the perspective of productivity and the like, the method preferably includes curing a curable composition by heat or an active energy ray. Specifically, the anti-glare film, including the anti-glare layer including the recesses and protrusions formed through liquid phase spinodal decomposition, may be produced by the steps of applying the curable composition including at least one type of polymer component and at least one type of curable resin precursor component to the support (in particular, the transparent substrate layer) and drying the obtained body, phase separating through liquid phase spinodal decomposition the at least two components selected from the polymer component and the curable resin precursor component, then curing the phase separated curable composition by heat or an active energy ray.

In the phase-separating, the curable composition may include a solvent. The solvent can be selected according to the type and solubility of the polymer component and the curable resin precursor component, and may be at least a solvent which can uniformly dissolve a solid content (for example, a plurality of polymer components and a curable resin precursor component, a reaction initiator, and other additives). In particular, the phase separated structure may be controlled by adjusting the solubility of the solvent with regard to the polymer component and the curable resin precursor. Examples of such solvents include ketones (acetone, methyl ethyl ketone, methyl isobutyl ketone, cyclohexanone, and the like), ethers (dioxane, tetrahydrofuran, and the like), aliphatic hydrocarbons (hexane and the like), alicyclic hydrocarbons (cyclohexane and the like), aromatic hydrocarbons (toluene, xylene, and the like), halogenated carbons (dichloromethane, dichloroethane, and the like), esters (methyl acetate, ethyl acetate, butyl acetate, and the like), water, alcohols (ethanol, isopropanol, butanol, cyclohexanol, and the like), cellosolves [methyl cellosolve, ethyl cellosolve, propylene glycol monomethyl ether (1-methoxy-2-propanol), and the like], cellosolve acetates, sulfoxides (dimethyl sulfoxide and the like), and amides (dimethylformamide, dimethylacetamide, and the like). In addition, the solvent may be a mixed solvent.

Among these solvents, ketones such as methyl ethyl ketone are preferable, and a mixed solvent of ketones with alcohols (butanol and the like) and/or cellosolves (1-methoxy-2-propanol and the like) is particularly preferable. In the mixed solvent, the ratio of alcohols and/or cellosolves (total amount when the both are mixed) is, for example, from about 10 to 150 parts by weight, preferably from about 15 to 100 parts by weight, and more preferably from about 20 to 80 parts by weight (in particular, from 25 to 50 parts by weight) per 100 parts by weight of ketone. In the case where the combination including alcohols and cellosolves, the ratio of the cellosolves per 100 parts by weight of the alcohols is from about 1 to 100 parts by weight, preferably from about 10 to 80 parts by weight, and more preferably from about 30 to 70 parts by weight (in particular, from 40 to 60 parts by weight). In an embodiment of the present invention, the phase separation can be adjusted by the spinodal decomposition by the appropriate combination with the solvent to form the recesses and protrusions that can provide transparency and anti-glare properties in a compatible manner.

The concentration of a solute (polymer component, curable resin precursor component, reaction initiator, and other additives) in the mixed solution can be selected within the range in which the phase separation occurs and within the range in which casting properties and coating properties are not impaired, and is, for example, from about 1 to 80 wt. %, preferably from about 10 to 70 wt. %, and more preferably from about 20 to 60 wt. % (in particular, 30 to 55 wt. %).

Examples of the applying method include the known methods such as a roll coater, an air knife coater, a blade coater, a rod coater, a reverse coater, a bar coater, a comma coater, a dip squeeze coater, a die coater, a gravure coater, a micro gravure coater, a silk screen coater method, a dip method, a spray method, and a spinner method. Among these methods, the bar coater method or the gravure coater method are widely used. If necessary, the applying solution may be applied a plurality of times.

After the mixed solution is casted or applied, the phase separation by the spinodal decomposition can be induced by evaporating the solvent at a temperature lower than a boiling point of the solvent (for example, temperature that is from about 1 to 120° C., preferably from about 5 to 50° C., and particularly preferably from about 10 to 50° C. lower than the boiling point of the solvent). The solvent can be evaporated by being usually dried at a temperature of, for example, from about 30 to 200° C. (for example, from 30 to 100° C.), preferably from about 40 to 120° C., and more preferably from about 50 to 90° C. (in particular, from 60 to 85° C.) depending on the boiling point of the solvent.

Regularity or periodicity can be imparted to an average distance between the domains of the phase separated structure through such spinodal decomposition accompanied by the evaporation of the solvent.

In the curing, the dried curable composition is finally cured by active rays (ultraviolet rays, electron beams, and the like) or heat, so the phase separated structure formed through the spinodal decomposition can be promptly fixed. The curable composition may be cured by a combination of heating, light irradiation, and the like according to the type of the curable resin precursor component.

The heating temperature can be selected from an appropriate range, for example, from about 50 to 150° C. The light irradiation can be selected according to the type of the photocuring component or the like, and usually, ultraviolet rays, electron beams, and the like can be used. A generally used light source is typically an ultraviolet irradiation device.

Examples of the light source include a deep UV lamp, a low-pressure mercury lamp, a high-pressure mercury lamp, an ultrahigh-pressure mercury lamp, a halogen lamp, and a laser light source (light source such as a helium-cadmium laser and an excimer laser) in the case of the ultraviolet rays. The amount of irradiation light (irradiation energy) varies depending on the thickness of the coating film, and is, for example, from about 10 to 10000 mJ/cm$^2$, preferably from about 20 to 5000 mJ/cm$^2$, and more preferably from about 30 to 3000 mJ/cm$^2$. If necessary, the light irradiation may be performed in an inert gas atmosphere.

Display Device

The anti-glare film of the present invention can achieve transparency and anti-glare properties in a compatible manner. Thus, it can be used as an optical member of a display device with a liquid crystal display (LCD), an organic EL display, or a touch screen and is particularly advantageous used as an optical element of an LCD or an organic EL display.

In particular, the LCD may be a reflective LCD that utilizes external light to illuminate a display unit including liquid crystal cells or may be a transmissive LCD with a backlight unit configured to illuminate the display unit. In a reflective LCD, incident light is introduced from the exterior through the display unit, and transmitted light transmitted through the display unit is reflected by a reflective member to illuminate the display unit. In a reflective LCD, the anti-glare film of the present invention can be disposed forward in an optical path from the reflective member. For example, the anti-glare film of the present invention can be disposed at or layered on the front surface (visual viewing side front surface) of the display unit, and in particular, may be disposed at the front surface of an LCD with a collimated backlight unit and without a prism sheet.

In a transmissive LCD, the backlight unit may include a light guide plate (for example, a light guide plate having a wedge-shaped cross section) for allowing a light from a light source (a tubular light source such as a cold-cathode tube, a point light source such as a light emitting diode, or the like) incident from one side to emit from the front output surface. Also, as necessary, a prism sheet may be disposed at the front surface side of the light guide plate. Note that, typically, on the back surface of the light guide plate, a reflective member for reflecting light from a light source toward the output surface is disposed. In such a transmissive LCD, typically, the anti-glare film of the present invention can be disposed forward in an optical path from the light source. For example, the anti-glare film of the present invention can be disposed at or layered in between a light guide plate and a display unit, disposed at or layered on a front surface of a display unit, or the like.

In an organic EL display, an organic EL includes a light emitting element constituted for each pixel, and this light emitting element is typically formed of a negative electrode of a metal or the like/an electron-injecting layer/an electron-transporting layer/a light emitting layer/a hole-transporting layer/a hole-injecting layer/a positive electrode of indium tin oxide (ITO) or the like/a substrate such as a glass plate or a transparent plastic plate. Also, in an organic EL display, the anti-glare film of the present invention may be disposed in an optical path.

Also, the anti-glare film of the present invention may be used as an aftermarket protective film for preventing damage to an LCD (including an LCD which is a display device with a touch screen) or an organic EL display (including an organic EL display which is a display device with a touch screen).

EXAMPLE(S)

Hereinafter, the present invention is described in greater detail based on examples, but the present invention is not limited to these examples. The raw materials used in Examples and Comparative Examples are as follows, and the anti-glare film obtained was evaluated by the following method.

Raw Material

Acrylic polymer having a polymerizable group: "Cyclomer P", available from Daicel-Allnex Ltd.

Cellulose acetate propionate: "CAP-482-20", available from Eastman Chemical Company, degree of acetylation=2.5%, degree of propionylation=46%, number average molecular weight calibrated with polystyrene is 75000

Silicone acrylate: "EB1360", available from Daicel-Allnex Ltd.

Silicone based hard coat material: "AS-201S" available from TOKUSHIKI Co. Ltd.

Urethane acrylate A: "U-15HA" available from Shin-Nakamura Chemical Co., Ltd.

Urethane acrylate B: "AU-230" available from TOKUSHIKI Co. Ltd.

Dipentaerythritol hexaacrylate: "DPHA", available from Daicel-Allnex Ltd.

Nanosilica-containing acrylic UV curable compound: "XR39-C6210" available from Momentive Performance Materials Japan LLC.

Silica-containing acrylic ultraviolet curable compound: "Z-757-4RL" available from Aica Kogyo Company, Limited Acrylic ultraviolet curable compound: "Z-757-4CL" available from Aica Kogyo Company, Limited PMMA Beads A: "SSX-115", available from Sekisui Chemical Co., Ltd.

PMMA Beads B: "SSX-105", available from Sekisui Chemical Co., Ltd.

Cross-linked styrene beads: "SX-130H" available from Soken Chemical & Engineering Co., Ltd.

Fluorine-based compound A having a polymerizable group: "KY-1203" available from Shin-Etsu Chemical Co., Ltd.

Fluorine-based compound B having a polymerizable group: "Ftergent 602A" available from Neos Company Limited Photoinitiator A: "Irgacure 184" available from BASF Japan Ltd.

Photoinitiator B: "Irgacure 907" available from BASF Japan Ltd.

Polyethylene terephthalate (PET) film: "DIAFOIL" available from Mitsubishi Plastics, Inc.

Cellulose triacetate (TAC) film: "FUJITAC TG60UL" available from FUJIFILM Corporation.

Thickness of Coat Layer

Using an optical film thickness gauge, ten arbitrary points were measured, and an average value was calculated.

Haze

Haze was measured in accordance with JIS K7136 using a haze meter ("NDH-5000W" available from Nippon Denshoku Industries Co., Ltd.), with the front surface including the recesses and protrusions structure being disposed facing the light receiver.

Transmitted Hue (b*)

A spectrophotometer ("U-3010" available from Hitachi High-Tech Science Corporation) was used in accordance with JIS Z8781 to perform measurement.

60° Gloss

Measurement was performed at an angle of 60° using a gloss meter ("IG-320" available from Horiba, Ltd.) in accordance with JIS Z8741.

Anti-Glare Properties

The prepared anti-glare film was attached to a commercially available black acrylic plate by an optical adhesive, and the reflection image when illuminated by a three-wavelength fluorescent lamp was visually checked and evaluated according to the following criteria.

Excellent: Fluorescent light not visible

Good: Outline of fluorescent light is faintly visible

Marginal: The shape of fluorescent light is visible, but glare is suppressed

Coloration

A three-wavelength fluorescent lamp was pointed at the prepared anti-glare film and the coloration of the transmitted light was visually observed and evaluated on the basis of the following criteria.

Good: The film appears colorless and transparent when the fluorescent light is observed passing through the film Marginal: Appears slightly yellow or blue Poor: Appears clearly yellow or blue Example 1

A solution was prepared by dissolving 15.0 parts by weight of the acrylic polymer A having a polymerizable group, 3 parts by weight of the cellulose acetate propionate, 150 parts by weight of the nanosilica-containing acrylic UV curable compound, and 1 part by weight of the silicone acrylate in a mixed solvent of 101 parts by weight of methyl ethyl ketone and 24 parts by weight of 1-butanol.

This solution was casted onto a PET film using a wire bar (#20), and then left in an oven at 80° C. for 1 minute to evaporate the solvent, and a coating layer having a thickness of about 9 μm was formed.

Then, the coat layer was ultraviolet light cured by being irradiated with ultraviolet rays by a high-pressure mercury lamp for about 5 seconds (irradiation by integrated light amount of about 100 mJ/cm², same for below) to obtain the anti-glare film.

Example 2

A solution was prepared by dissolving 12.5 parts by weight of the acrylic polymer having a polymerizable group, 4 parts by weight of the cellulose acetate propionate, 150 parts by weight of the nanosilica-containing acrylic UV curable compound, and 1 part by weight of the silicone acrylate in a mixed solvent of 81 parts by weight of methyl ethyl ketone, 24 parts by weight of 1-butanol, and 13 parts by weight of 1-methoxy-2-propanol.

This solution was casted onto a PET film using a wire bar (#20), and then left in an oven at 80° C. for 1 minute to evaporate the solvent, and a coating layer having a thickness of about 9 μm was formed.

Then, the coat layer was ultraviolet light cured by being irradiated with ultraviolet rays by a high-pressure mercury lamp for about 5 seconds to obtain the anti-glare film.

Example 3

A solution was prepared by dissolving 45.6 parts by weight of the acrylic polymer having a polymerizable group, 2.3 parts by weight of the cellulose acetate propionate, 70.7 parts by weight of the urethane acrylate A, 8.2 parts by weight of the dipentaerythritol hexaacrylate, 0.6 part by weight of the silicone acrylate, 0.1 parts by weight of the fluorine-based compound B having a polymerizable group, 1 part by weight of the photoinitiator A, and 1 part by weight of the photoinitiator B in a mixed solvent of 128 parts by weight of methyl ethyl ketone, 25 parts by weight of 1-butanol, and 31 parts by weight of cyclohexanone.

This solution was casted onto a TAC film using a wire bar (#16), and then left in an oven at 80° C. for 1 minute to evaporate the solvent, and a coating layer having a thickness of about 7 μm was formed.

Then, the coat layer was ultraviolet light cured by being irradiated with ultraviolet rays by a high-pressure mercury lamp for about 5 seconds to obtain the anti-glare film.

Example 4

A solution was prepared by dissolving 12.5 parts by weight of the acrylic polymer having a polymerizable group, 5.5 parts by weight of the cellulose acetate propionate, 149 parts by weight of the nanosilica-containing acrylic UV curable compound, and 0.1 parts by weight of the fluorine-based compound B having a polymerizable group in a mixed solvent of 129 parts by weight of methyl ethyl ketone, 24 parts by weight of 1-butanol, and 13 parts by weight of 1-methoxy-2-propanol.

This solution was casted onto a PET film using a wire bar (#14), and then left in an oven at 80° C. for 1 minute to evaporate the solvent, and a coating layer having a thickness of about 5 μm was formed.

Then, the coat layer was ultraviolet light cured by being irradiated with ultraviolet rays by a high-pressure mercury lamp for about 5 seconds to obtain the anti-glare film.

Example 5

A solution was prepared by dissolving 36.9 parts by weight of the acrylic polymer having a polymerizable group, 3.0 parts by weight of the cellulose acetate propionate, 55.0 parts by weight of the urethane acrylate A, 0.7 parts by weight of the silicone acrylate, 22.9 part by weight of the dipentaerythritol hexaacrylate, 0.1 parts by weight of the fluorine-based compound B having a polymerizable group, 1 part by weight of the photoinitiator A, and 1 part by weight of the photoinitiator B in a mixed solvent of 144 parts by weight of methyl ethyl ketone and 21 parts by weight of 1-butanol.

This solution was casted onto a TAC film using a wire bar (#18), and then left in an oven at 80° C. for 1 minute to evaporate the solvent, and a coating layer having a thickness of about 8 μm was formed.

Then, the coat layer was ultraviolet light cured by being irradiated with ultraviolet rays by a high-pressure mercury lamp for about 5 seconds to obtain the anti-glare film.

Example 6

A solution was prepared by dissolving 50 parts by weight of the acrylic polymer having a polymerizable group, 4 parts by weight of the cellulose acetate propionate, 76 parts by weight of the urethane acrylate A, 1 part by weight of the silicone acrylate, 1 part by weight of the photoinitiator A, and 1 part by weight of the photoinitiator B in a mixed solvent of 176 parts by weight of methyl ethyl ketone and 28 parts by weight of 1-butanol.

This solution was casted onto a TAC film using a wire bar (#18), and then left in an oven at 80° C. for 1 minute to evaporate the solvent, and a coating layer having a thickness of about 8 μm was formed.

Then, the coat layer was ultraviolet light cured by being irradiated with ultraviolet rays by a high-pressure mercury lamp for about 5 seconds to obtain the anti-glare film.

Example 7

A solution was prepared by dissolving 3 parts by weight of the cellulose acetate propionate, 97 parts by weight of the urethane acrylate A, 90 parts by weight of the PMMA Beads B, 1 part by weight of the photoinitiator A, and 1 part by weight of the photoinitiator B in a mixed solvent of 277 parts by weight of methyl ethyl ketone and 23 parts by weight of 1-butanol.

This solution was casted onto a PET film using a wire bar (#6), and then left in an oven at 80° C. for 1 minute to evaporate the solvent, and a coating layer having a thickness of about 1 μm was formed.

Then, the coat layer was ultraviolet light cured by being irradiated with ultraviolet rays by a high-pressure mercury lamp for about 5 seconds to obtain the anti-glare film.

Reference Example 1

A solution was prepared by dissolving 39 parts by weight of a urethane acrylate B, 15.7 parts by weight of a silicon-based hard coat material, 0.3 parts by weight of PMMA Beads A, and 6.1 parts by weight of crosslinked styrene beads in 38 parts by weight of methyl ethyl ketone.

This solution was casted onto a PET film using a wire bar (#14), and then left in an oven at 100° C. for 1 minute to evaporate the solvent, and a coating layer having a thickness of about 6 μm was formed.

Then, the coat layer was ultraviolet light cured by being irradiated with ultraviolet rays by a high-pressure mercury lamp for about 5 seconds to obtain the anti-glare film.

Reference Example 2

A solution was prepared by mixing 50 parts by mass of the silica-containing acrylic ultraviolet curable compound and 150 parts by mass of the acrylic ultraviolet curable compound. This solution was casted onto a PET film using a wire bar (#14), and then left in an oven at 80° C. for 1 minute to evaporate the solvent, and a coating layer having a thickness of about 7 μm was formed.

Then, ultraviolet light curing was performed by irradiation with ultraviolet rays by an ultraviolet lamp for about 5 seconds to obtain the anti-glare film.

Table 1 shows the evaluation results of the obtained anti-glare films according to the Examples and the Reference Examples.

TABLE 1

| Items | Example | | | | | | | Reference example | |
| --- | --- | --- | --- | --- | --- | --- | --- | --- | --- |
|  | 1 | 2 | 3 | 4 | 5 | 6 | 7 | 1 | 2 |
| Haze (%) | 68 | 80 | 76 | 95 | 31 | 44 | 92 | 83 | 3 |
| b* | 2.49 | 1.91 | 1.58 | −0.55 | 2.38 | 3.00 | −2.39 | 16.22 | 1.26 |
| 60° gloss (%) | 8 | 4 | 5 | 0.6 | 21 | 8 | 0.9 | 12 | 90 |
| Anti-glare properties | Good | Excellent | Excellent | Excellent | Good | Good | Good | Good | Marginal |
| Coloration | Marginal | Good | Good | Good | Good | Marginal | Marginal | Poor | Good |

As can be seen from the results shown in Table 1, the anti-glare film of the Examples had high anti-glare properties and excellent coloration (colorless transparency).

INDUSTRIAL APPLICABILITY

The anti-glare film of the present invention can be used as an anti-glare film that is used in various display devices, such as LCDs, cathode tube display devices, organic or inorganic EL displays, field emission displays (FEDs), surface-conduction electron-emitter displays (SEDs), rear projection television displays, plasma displays, and display devices with a touch screen.

In addition, the anti-glare film of the present invention is applicable to screens of various sizes and can be used in display devices with small-sized and mobile-sized screen (for example, display devices with a display and/or touch screen including car navigation displays, game consoles, smart phones, and tablet PCs and the like), display devices with a medium-sized screen (for example, PCs including notebook type PCs or laptop type PCs, and desktop type PCs, televisions, and the like), and display devices with a large-sized screen (for example, digital signage and the like). The display device can be appropriately selected depending on the difference in resolution, but from the perspective of achieving transparency and anti-glare properties in a compatible manner, the anti-glare film is advantageously used in a display device with a medium-sized screen or a large-sized screen, for example.

Also, the film including the anti-glare layer containing the curable resin precursor component has superior scratch resistance. Thus, it can be used as an aftermarket protective film for LCDs and organic EL displays.

The invention claimed is:
1. A display device comprising an anti-glare film having an absolute value of a chromaticity b* of transmitted light being 3 or less, a 60° gloss being 10% or less and a haze being 30% or greater, wherein
- the display device is an organic EL display or a liquid crystal display, wherein
- the anti-glare film comprises a transparent substrate layer; and
- an anti-glare layer formed on at least one surface of the transparent substrate layer, wherein
- the anti-glare layer is a cured product of a curable composition comprising one or more types of a polymer component and one or more types of a curable resin precursor component, and wherein
- the curable resin precursor component comprises a silica nanoparticle and/or a fluorine atom, and wherein
- the ratio of the silica nanoparticle is 10 to 90 wt. % with respect to the entire curable resin precursor component.

2. The display device according to claim 1, wherein at least two components selected from the polymer component and the curable resin precursor component are able to be phase separated through liquid phase spinodal decomposition.

3. The display device according to claim 1, wherein the polymer component comprises a (meth) acrylic polymer and/or a cellulose ester, and wherein the (meth) acrylic polymer optionally has a polymerizable group.

4. The display device according to claim 1, wherein the cured resin precursor component comprises at least one type selected from polyfunctional (meth)acrylate, epoxy (meth)acrylate, polyester (meth)acrylate, urethane (meth)acrylate, and silicone (meth)acrylate.

5. The display device according to claim 1, wherein the total light transmittance of the anti-glare film is 70% or greater.

6. The display device according to claim 1, wherein the cured resin precursor component comprises a silica nanoparticle and a fluorine atom.

7. A method for producing the display device described in claim 1, comprising:
- disposing the anti-glare film on said display device, wherein said anti-glare film is prepared by curing said curable composition by heat or an active energy ray.

8. The method for producing the display device according to claim 7, further comprising:
- phase separating, through liquid phase spinodal decomposition, at least two components selected from a polymer component and a curable resin precursor component by applying a curable composition comprising one or more types of polymer components and one or more types of curable resin precursor components on a support and drying, wherein
- in the curing, a phase separated curable composition is cured by heat or an active energy ray.

9. A method of increasing anti-glare properties and transparency of an anti-glare film, comprising:
- adjusting an absolute value of a chromaticity $b^*$ of transmitted light being in a range of 3 or less, a 60° gloss in a range of 10% or less and adjusting a haze being in a range of 30% or greater, wherein
- the anti-glare film comprises a transparent substrate layer; and
- an anti-glare layer formed on at least one surface of the transparent substrate layer, wherein
- the anti-glare layer is a cured product of a curable composition comprising one or more types of a polymer component and one or more types of a curable resin precursor component, and wherein
- the curable resin precursor component comprises a silica nanoparticle and/or a fluorine atom, and wherein
- the ratio of the silica nanoparticle is 10 to 90 wt. % with respect to the entire curable resin precursor component.

* * * * *